US011706509B2

United States Patent
Lee et al.

(10) Patent No.: US 11,706,509 B2
(45) Date of Patent: Jul. 18, 2023

(54) ELECTRONIC DEVICE INCLUDING CAMERA MODULE

(71) Applicant: Samsung Electronics Co., Ltd., Suwon-si (KR)

(72) Inventors: Seung Hak Lee, Hwaseong-si (KR); Hyunjin Kang, Seoul (KR); In-Sang Song, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 17/699,393

(22) Filed: Mar. 21, 2022

(65) Prior Publication Data
US 2022/0360697 A1 Nov. 10, 2022

(30) Foreign Application Priority Data
May 7, 2021 (KR) .................. 10-2021-0058934

(51) Int. Cl.
| H04N 5/225 | (2006.01) |
| H04N 5/247 | (2006.01) |
| H04N 23/52 | (2023.01) |
| H04N 23/54 | (2023.01) |
| H04N 23/55 | (2023.01) |
| H04N 23/57 | (2023.01) |
| H04N 23/90 | (2023.01) |

(52) U.S. Cl.
CPC ............ *H04N 23/52* (2023.01); *H04N 23/54* (2023.01); *H04N 23/55* (2023.01); *H04N 23/57* (2023.01); *H04N 23/90* (2023.01)

(58) Field of Classification Search
CPC ........ H04N 23/52; H04N 23/54; H04N 23/55; H04N 23/57; H04N 23/90; H04N 23/45; H01L 27/14618
See application file for complete search history.

(56) References Cited

U.S. PATENT DOCUMENTS

| 7,144,135 B2 | 12/2006 | Martin et al. |
| 8,139,933 B2 | 3/2012 | Hashizume et al. |
| 8,913,178 B2 | 12/2014 | Lee et al. |

(Continued)

FOREIGN PATENT DOCUMENTS

| JP | 2013172168 A | 9/2013 |
| JP | 2016082261 A | 5/2016 |

(Continued)

*Primary Examiner* — Padma Haliyur
(74) *Attorney, Agent, or Firm* — Muir Patent Law, PLLC (57) ABSTRACT

An electronic system including a camera module comprises a camera module on a metal plate, a metal flange surrounding the camera module, a metal frame connected to the metal flange, and a first adhesion member between the metal flange and the metal plate. The camera module includes a substrate including a cavity, an image sensor in the cavity, and a lens assembly on the image sensor. An area of the metal plate is greater than that of the substrate, from a plan view. The metal plate includes a first part overlapping the substrate from the plan view, and a second part not overlapping the substrate from the plan view. The second part corresponds to an edge portion of the metal plate. The image sensor contacts the metal plate through an adhesive material. A lower portion of the metal flange and the second part of the metal plate contact the first adhesion member.

20 Claims, 8 Drawing Sheets

(56) References Cited

U.S. PATENT DOCUMENTS

| | | | |
|---|---|---|---|
| 9,607,972 | B2 | 3/2017 | Iwafuchi et al. |
| 9,621,769 | B2 | 4/2017 | Mai et al. |
| 9,756,229 | B2 * | 9/2017 | Seger ................ H04N 23/57 |
| 10,250,788 | B2 | 4/2019 | Zhang et al. |
| 2019/0163037 | A1 * | 5/2019 | Koyama ............. B64D 47/08 |
| 2020/0093012 | A1 * | 3/2020 | Woo .................. H01R 12/79 |
| 2020/0319307 | A1 | 10/2020 | Huh et al. |
| 2020/0322467 | A1 | 10/2020 | Huh et al. |
| 2021/0399106 | A1 * | 12/2021 | Yamazaki ........ H01L 29/66969 |

FOREIGN PATENT DOCUMENTS

| | | | |
|---|---|---|---|
| JP | 3732438 | B2 | 7/2020 |
| KR | 10-2011-0055899 | A | 5/2011 |
| KR | 101945201 | B1 | 4/2019 |

\* cited by examiner

ELECTRONIC DEVICE INCLUDING CAMERA MODULE

CROSS-REFERENCE TO RELATED APPLICATION

This U.S. nonprovisional application claims priority under 35 U.S.C § 119 to Korean Patent Application No. 10-2021-0058934 filed on May 7, 2021 in the Korean Intellectual Property Office, the disclosure of which is hereby incorporated by reference in its entirety.

BACKGROUND

The present inventive concepts relate to an electronic device including a camera module.

Electronic devices, for example, mobile electronic devices have been used in many fields closely connected to with our daily lives.

Such electronic devices are manufactured in various sizes in accordance with the functions and preference of users, and may include a large-sized touch display for securing wide visibility and convenient operation. An electronic device may include at least one camera module. For example, the electronic device may include at least one camera module located on the display or near the display.

SUMMARY

Some embodiments of the present inventive concepts provide an electronic device including a camera module whose reliability is increased due to an enlarged thermal discharge path.

According to some embodiments of the present inventive concepts, an electronic system may comprise: a metal plate; at least a first camera module on the metal plate; a metal flange that covers a sidewall of the first camera module; a metal frame connected to the metal flange; and a first adhesive material between the metal flange and the metal plate that attaches the metal flange to the metal plate. The first camera module may include: a substrate that includes at least one cavity, the cavity penetrating the substrate; an image sensor in the cavity; a lens assembly on the image sensor; and an actuator combined with the lens assembly. An area from a plan view of the metal plate may be greater than an area from the plan view of the substrate. The metal plate may include: a first part that overlaps the substrate from the plan view; and a second part that does not overlap the substrate from the plan view. The second part may correspond to an edge portion of the metal plate. The image sensor may contact the metal plate through a second adhesive material. A lower portion of the metal flange and the second part of the metal plate may contact the first adhesive material.

According to some embodiments of the present inventive concepts, an electronic system may comprise: a metal plate; a camera module on the metal plate; a metal flange that surrounds sidewalls of the camera module; a metal frame connected to the metal flange; a first adhesion member between the metal flange and the metal plate; and a second adhesion member between the metal flange and the camera module. The camera module may include: a substrate having a top surface and a bottom surface, and that includes at least one cavity; an image sensor in the cavity; and a lens assembly on the image sensor. The metal flange may include: a body that extends in a direction perpendicular to the substrate; and a protrusion that protrudes from the body and along a direction parallel to the top surface of the substrate. A bottom surface of the body included in the metal flange and a top surface of the metal plate may contact with first adhesion member. A lateral surface of the body included in the metal flange and a lateral surface of the camera module may contact the second adhesion member.

According to some embodiments of the present inventive concepts, an electronic system may comprise: a metal plate; at least a first camera module on the metal plate; a metal flange that covers a sidewall of the first camera module; a metal frame connected to the metal flange; and a first adhesion member between the metal flange and the metal plate. The first camera module may include: a substrate that includes at least one cavity, the cavity penetrating the substrate; a passive element on the substrate; an image sensor in the cavity; an infrared filter on the image sensor; an inner housing that surrounds the infrared filter; a lens assembly on the infrared filter; an actuator on the inner housing and combined with the lens assembly; and an outer housing that surrounds the inner housing and the actuator. An area of the metal plate, from a plan view, may be greater than an area of the substrate, from the plan view. The metal plate may include: a first part that overlaps the substrate from the plan view; and a second part that does not overlap the substrate from the plan view. The image sensor may be in thermal contact with the metal plate. The second part may correspond to an edge portion of the metal plate. A lower portion of the metal flange and the second part of the metal plate may contact the first adhesion member.

DETAILED DESCRIPTION OF EMBODIMENTS

The following will now describe an electronic device including a camera module according to various embodiments of the present inventive concepts with reference to the accompanying drawings.

Figure 1:
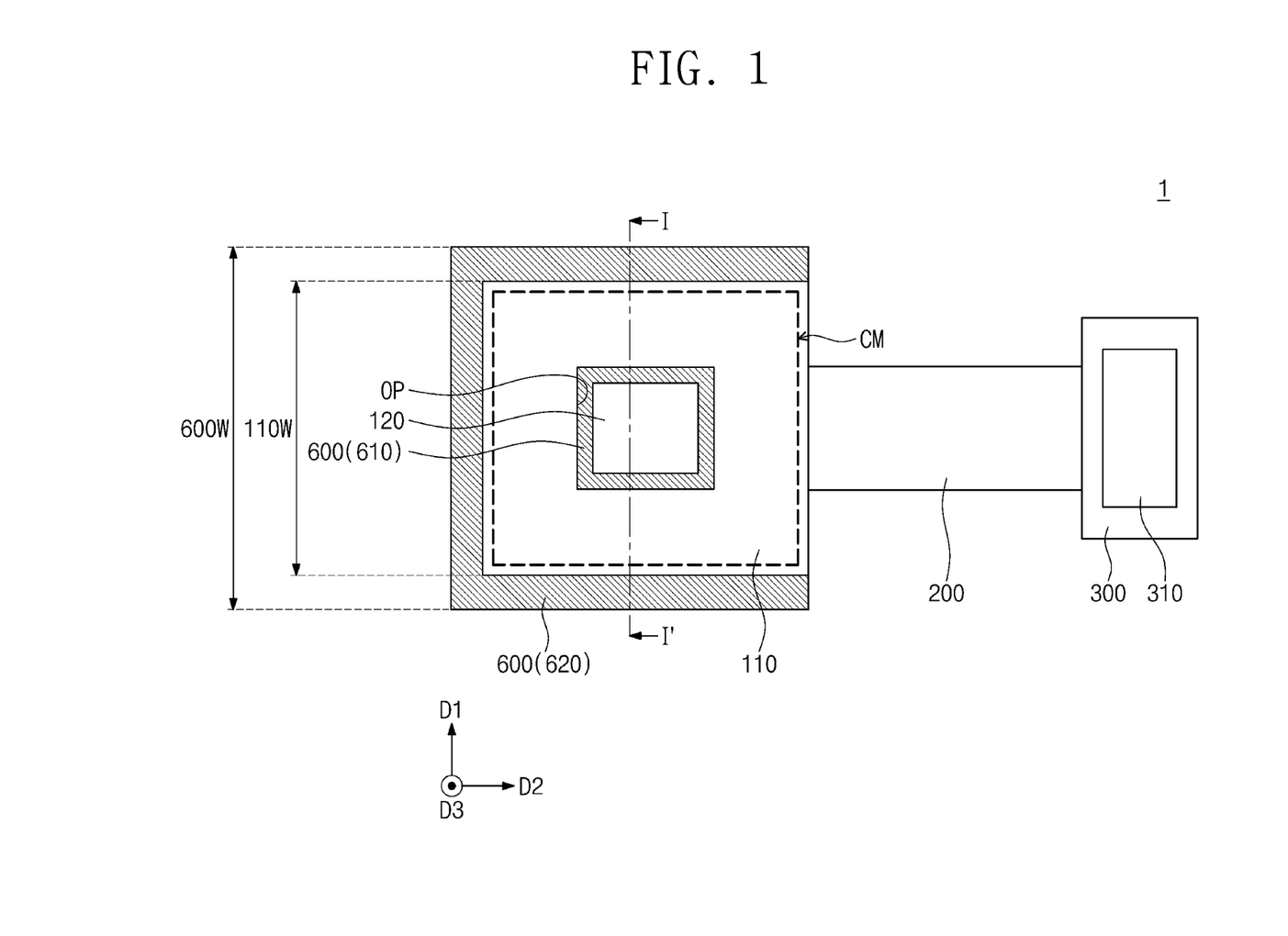
FIG. 1 illustrates a plan view showing an electronic device including a camera module according to some embodiments of the present inventive concepts.
Figure 2A:
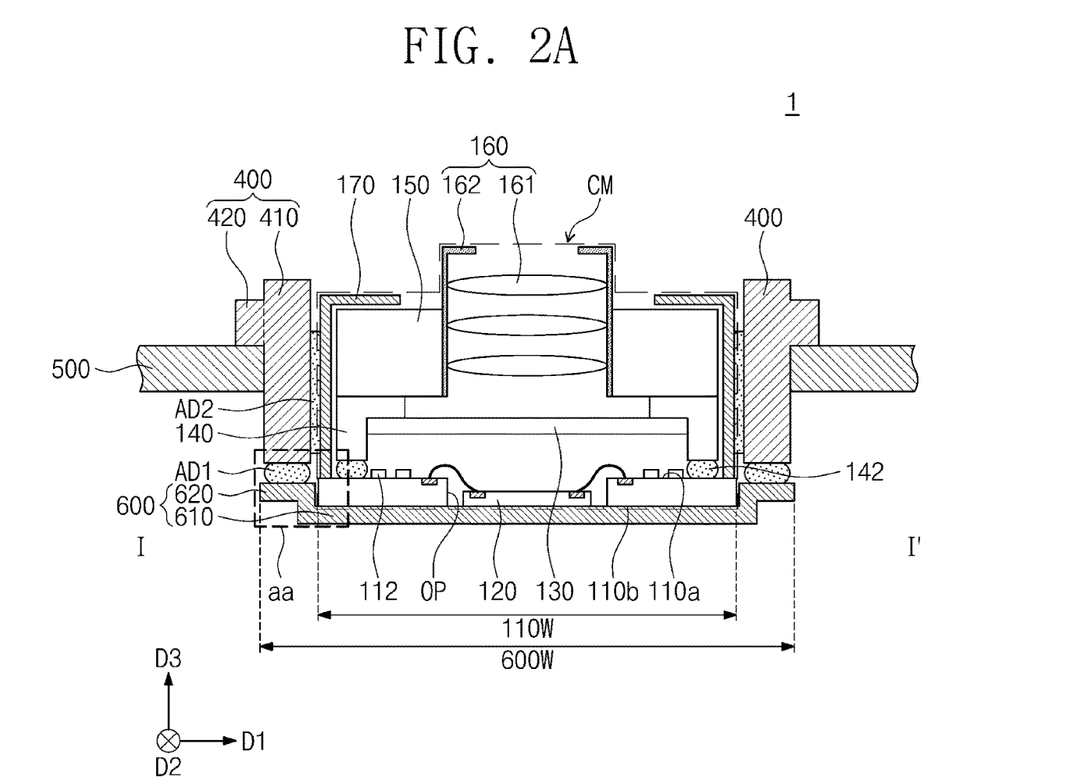
FIG. 2A illustrates a cross-sectional view taken along line I-I' of FIG. 1, according to some embodiments.

FIG. 1 illustrates a plan view showing an electronic device including a camera module according to some embodiments of the present inventive concepts. FIG. 2A illustrates a cross-sectional view taken along line I-I' of FIG.

Figure 2B:
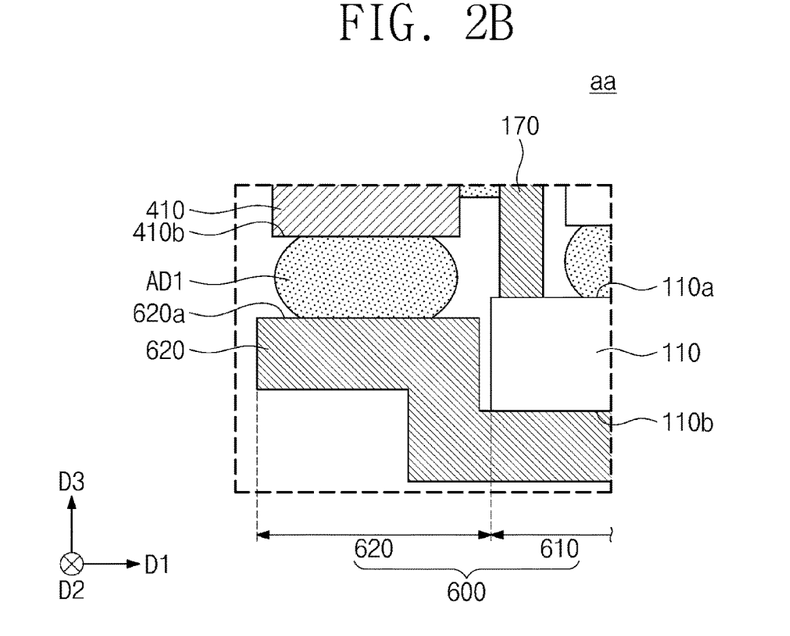
FIG. 2B illustrates an enlarged view showing section aa of FIG. 2A.

1. FIG. 2B illustrates an enlarged view showing section aa of FIG. 2A. For clear representation, FIG. 1 omits the illustration of some components shown in FIG. 2A.

An electronic device 1 may be, for example, a mobile phone or tablet, a drone, an action cam, or a surveillance apparatus each, of which includes a camera module CM.

The camera module CM may include a substrate 110, an image sensor 120, an infrared (IR) filter 130, an inner housing 140, an actuator 150, a lens assembly 160, and an outer housing 170.

According to some embodiments, the camera module CM may be provided with a flexible substrate 200 connected to the substrate 110 and with an additional substrate 300 connected through the flexible substrate 200 to the substrate 110. A connector 310 may be provided on the additional substrate 300. The connector 310 may be an electronic member that communicates power and/or data with an external electronic apparatus. The substrate 110, the flexible substrate 200, and the additional substrate 300 may all be, for example, printed circuit boards.

The substrate 110 may include at least one cavity OP that penetrates the substrate 110. For example, the cavity OP may penetrate entirely through the substrate 110. The image sensor 120 may be provided in the cavity OP of the substrate 110. The image sensor 120 may convert external images into electrical signals and send the electrical signals to a display to display the electrical signals, to a processor to process the electrical signals, and/or to a memory to store the electrical signals. The electrical signals converted from external images may be described as converted electrical signals. The image sensor 120 may be one of a charge coupled device (CCD) or an CMOS image sensor (CIS). As the image sensor 120 is equipped in the cavity OP of the substrate 110, the camera module CM may decrease in total height. The image sensor 120 may be electrically connected to the substrate 110 through bonding wires or the like.

The substrate 110 may have a first surface 110a and a second surface 110b opposite the first surface 110a. The first surface 110a and the second surface 110b may respectively correspond to a top surface and a bottom surface of the substrate 110. Spatially relative terms, such as "beneath," "below," "lower," "above," "upper," "top," "bottom," and the like, may be used herein for ease of description to describe positional relationships, such as illustrated in the figures, for example. It will be understood that the spatially relative terms encompass different orientations of the device in addition to the orientation depicted in the figures. In this description below, a first direction D1 is defined to indicate a direction parallel to the top surface 110a of the substrate 110. A second direction D2 is defined to indicate a direction parallel to the top surface 110a of the substrate 110 and orthogonal to the first direction D1. The first direction D1 and second direction D2 may be described as horizontal directions. A third direction D3 is defined to indicate a direction perpendicular to the top surface 110a of the substrate 110. The third direction D3 may be described as a vertical direction. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

The substrate 110 may be provided on its top surface 110a with one or more passive elements 112 such as a capacitor.

The IR filter 130 may be provided on the image sensor 120. The IR filter 130 may remove wavelengths in a range of near-infrared radiation.

The inner housing 140 may be provided on the top surface 110a of the substrate 110. The inner housing 140 may include, for example, a plastic (e.g., a polymer), or a combination of plastics. The inner housing 140 may serve to fix the IR filter 130 and to support the actuator 150. An adhesive material 142 (e.g., a thermal interface material (TIM) may be provided between the inner housing 140 and the top surface 110a of the substrate 110. A layer formed by an adhesive material as described herein, for any of the various components described herein, may be referred to as an adhesion member.

The lens assembly 160 may be provided on the IR filter 130. The lens assembly 160 may include a plurality of lenses 161 and a lens barrel 162 that fixes the lenses 161.

The actuator 150 may be provided on the inner housing 140. The actuator 150 may combine with (e.g., may be attached to) an outer side of the lens barrel 162. The actuator 150 may drive the lens assembly 160 to move in a vertical direction and/or in a horizontal direction. The actuator 150 may include, for example, a magnet and a coil.

The substrate 110 may be provided on its top surface 110a with the outer housing 170 that surrounds the actuator 150 and the inner housing 140. The outer housing 170 may be described as a shield can. The outer housing 170 may include or be formed of metal, for example. The outer housing 170 may serve to prevent electromagnetic waves from being externally discharged from the camera module CM and to protect the camera module CM. The outer housing 170 may be connected to a ground pad positioned on the top surface 110a of the substrate 110 and may use a ground circuit to remove electromagnetic waves.

The camera module CM may be configured such that the lenses 161 receive optical images of objects and the received optical images are transferred to the IR filter 130. The IR filter 130 may block infrared radiation from the received optical images, and then the image sensor 120 may be irradiated with the optical images. The image sensor 120 may convert the irradiated optical images into electrical signals, and the electrical signals may be transferred through the substrate 110. The transferred electrical signals may form images on a display (e.g., LCD or OLED) in the electronic device 1.

A metal plate 600 may be provided below the camera module CM. In this sense, the camera module CM may be provided on the metal plate 600.

The substrate 110 and the image sensor 120 may combine through an adhesive material with the metal plate 600 (e.g., may be attached to the metal plate 600 through the adhesive material). The adhesive material may be, for example, a thermal interface material (TIM). The metal plate 600 may include or may be formed of, for example, one or more of stainless steels (SUS) and copper alloys.

When viewed in plan view, the metal plate 600 may have an area greater than that of the substrate 110. The metal plate 600 may have a first width 600W in the first direction D1. The substrate 110 may have a second width 110W in the first direction D1. The first width 600W may be greater than the second width 110W. For example, the first width 600W may be about 1.1 times to about 1.5 times the second width 110W. Though not shown, in one embodiment, in the second direction D2, a width of the metal plate 600 may be greater than a width of the substrate 110, for example, by about 1.1 times to 1.5 times. Or, in one embodiment, in the second direction D2, widths of the metal plate and the substrate 110 may be the same. Terms such as "same," "equal," "planar," "coplanar," "parallel," and "perpendicular," as used herein encompass identicality or near identicality including variations that may occur, for example, due to manufacturing processes. The term "substantially" may be used herein to emphasize this meaning, unless the context or other statements indicate otherwise. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The metal plate 600 may include a first part 610 and a second part 620. The first part 610 of the metal plate 600 may be a segment that vertically overlaps the substrate 110 and the image sensor 120 and is exposed to the cavity OP of the substrate 110.

The second part 620 of the metal plate 600 may be a segment that does not vertically overlap the substrate 110 and that corresponds to an edge portion of the metal plate 600.

A metal flange 400 may be provided on the second part 620 of the metal plate 600. The metal flange 400 may include or be formed of aluminum, zinc, or any alloy thereof. A first adhesion pattern AD1 may be provided between the metal flange 400 and a top surface 620a of the second part 620 included in the metal plate 600. The first adhesion pattern AD1 may include or may be an adhesive material, for example, a thermal interface material (TIM).

The metal flange 400 may serve as a frame including an opening that corresponds to a maximum diameter of the camera module CM. The metal flange 400 may not be limited to the shape mentioned above.

The metal flange 400 may include a body 410 and a protrusion 420. The body 410 may extend along the third direction D3. An inner wall of the body 410 may face the camera module CM. A second adhesion pattern AD2 may be interposed between the outer housing 170 and the inner wall of the body 410. The outer housing 170 and the inner wall of the body 410 (e.g., a lateral surface of the outer housing 170 that forms a lateral surface of the camera module CM, and a lateral surface of the body 410) may contact the second adhesion pattern AD2. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present at the point of contact. Components herein may be described as "contacting" or being "in contact with" each other. The use of "contact," "contacting," or "in contact with" as used herein are directly coupled to each other (e.g., physically touch each other) unless otherwise noted. Items described as contacting each other through an adhesive material or through some other component have only the adhesive material or other component therebetween. Components described as "in thermal communication" or "in thermal contact" with each other, or as "thermally contacting" each other, either contact each other through direct coupling so that heat can be transferred directly from one component to the other, or are connected using thermally conductive components therebetween (such as a thermal interface material) that are intended to transfer heat between the components. The second adhesion pattern AD2 may include or be formed of the same material as that of the first adhesion pattern AD1.

The protrusion 420 may be a segment that protrudes from the body 410 in the first direction D1 and/or the second direction D2. The protrusion 420 may combine through an adhesive material with the metal frame 500. Though not shown in FIGS. 2A and 2B, the camera module CM may have a rectangular shape (e.g., a square shape) from a plan view, and the first body 410 and protrusion 420 may have a rectangular shape (e.g., a square shape) from a plan view that surrounds the camera module CM. The first body 410 may cover (e.g., through only an adhesive material) all sidewalls of the camera module CM, thus surrounding the camera module CM.

The metal flange 400 may serve to fix the camera module CM to the metal frame 500.

Referring to FIGS. 2A and 2B, the second part 620 of the metal plate 600 may have a shape that is bent in a direction away from the substrate 110. For example, the second part 620 of the metal plate 600 may have a flipped "L" shape. The bent shape at each end of the metal plate 600 may form a "Z" shape, for example, that first bends upward, and then bends outward.

The metal plate 600 may have a step difference between the first part 610 and the second part 620. The top surface 620a of the second part 620 included in the metal plate 600 may be located at a level (e.g., vertical level in the third direction D3) between those of the top and bottom surfaces 110a and 110b of the substrate 110. An adhesive material may be provided between the metal plate 600 and the substrate 110 and between the metal plate 600 and the image sensor 120 (e.g. at a top surface of the metal plate 600 and at bottom surfaces of the substrate 110 and image sensor 120). A rolling process may be employed such that the adhesive material may be used to combine the metal plate 600 and the substrate 110 with each other (e.g., to attach the metal plate 600 to the substrate 110). A roller may be used to provide the top surface 110a of the substrate 110 with pressure to combine the metal plate 600 and the substrate 110 with each other. The top surface 620a of second part 620 included in the metal plate 600 may be located at a vertical level lower than that of the top surface 110a of the substrate 110, and thus the metal plate 600 may be free of damage even in the rolling process.

The body 410 of the metal flange 400 may have a bottom surface 410b that contacts the first adhesion pattern AD1. The bottom surface 410b may be at a lowermost portion of the body 410 of the metal flange 400. The second part 620 of the metal plate 600 may contact the first adhesion pattern AD1. The body 410 of the metal flange 400 and the second part 620 of the metal plate 600 may be spaced apart from each other across the first adhesion pattern AD1 (e.g., in the third direction D3). In addition, the body 410 of the metal flange 400 may vertically overlap the second part 620 of the metal plate 600, e.g., from a plan view.

Figure 2C:
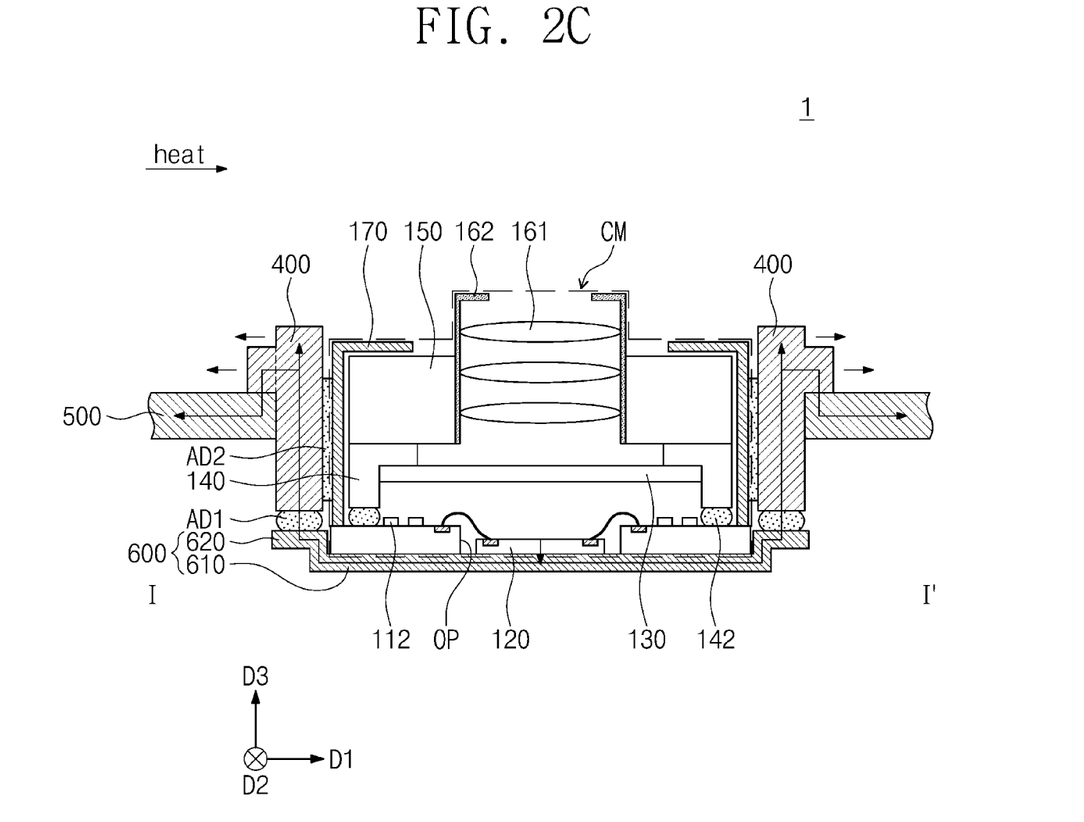
FIG. 2C illustrates a cross-sectional view conceptually showing heat transfer in an electronic device including a camera module.

FIG. 2C illustrates a cross-sectional view conceptually showing heat transfer in an electronic device including a camera module.

According to prior art, heat may be generated from image sensors during use of camera modules, and the heat may induce the degradation of resolution and the occurrence of noise in captured images.

The electronic device 1 including the camera module CM according to the present inventive concepts may be configured to easily discharge heat generated from the image sensor 120.

The image sensor 120 may be configured to contact the metal plate 600 through an adhesive material. The metal plate 600 may include the second part 620 that extends to a location below the body 410 of the metal flange 400. The body 410 of the metal flange 400 and the second part 620 of the metal plate 600 may be connected to each other through the first adhesion pattern AD1, and this configuration may increase a thermal discharge path.

The protrusion 420 of the metal flange 400 may contact the metal frame 500, and may transfer heat to the metal frame 500 of the electronic device 1, which may result in an increase in thermal radiation effect. Because there is more contact area when using the protrusion 420 than if a protrusion is not used, this also can increase the heat transfer to the metal frame 500.

Figure 3A:
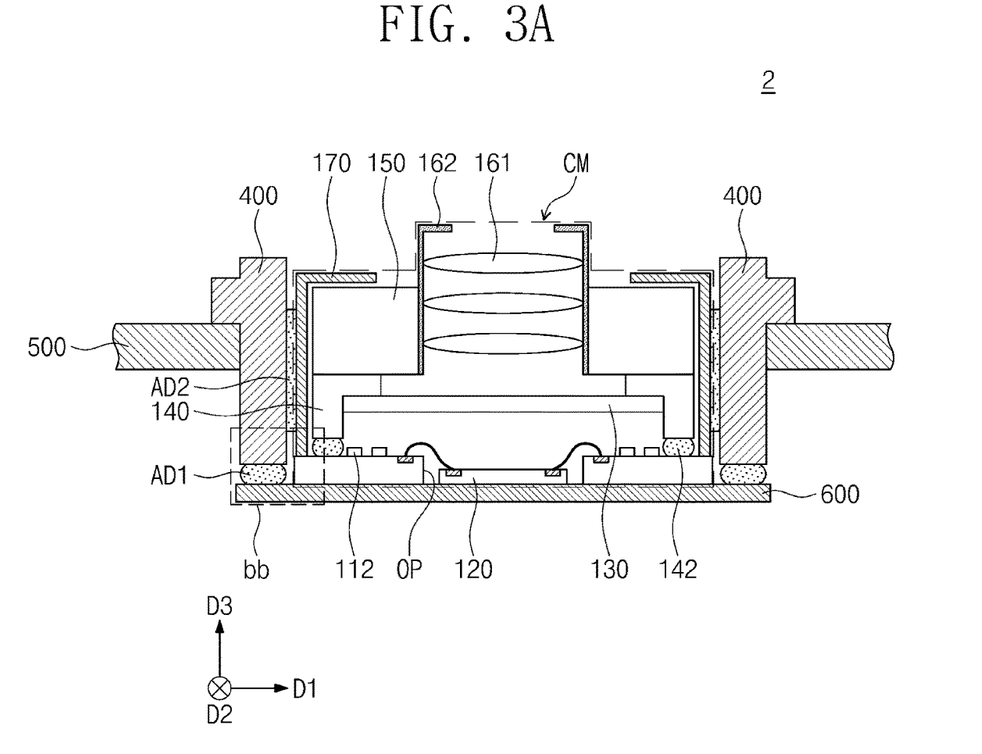
FIG. 3A illustrates a cross-sectional view taken along line I-I' of FIG. 1, according to some embodiments.
Figure 3B:
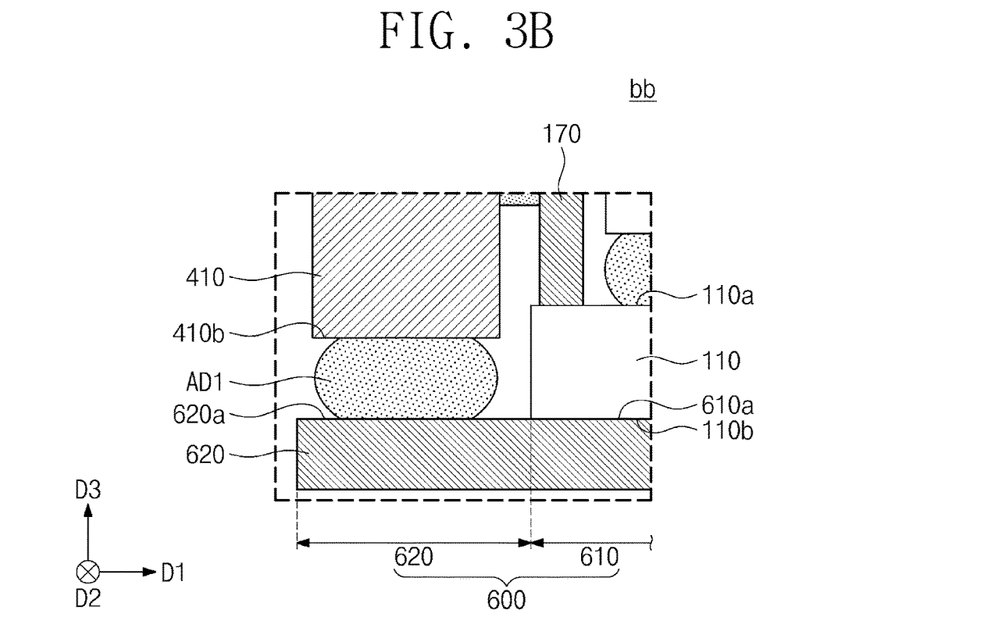
FIG. 3B illustrates an enlarged view showing section bb of FIG. 3A.

FIG. 3A illustrates a cross-sectional view taken along line I-I' of FIG. 1, according to some embodiments. FIG. 3B illustrates an enlarged view showing section bb of FIG. 3A. Except for the following discussion, the description of features that are the same as those in FIGS. 1 and 2A to 2C will be omitted in order to avoid repetition.

Referring to FIGS. 3A and 3B, an electronic device 2 according to some embodiments may include a metal plate 600 whose first part 610 has a top surface 610a at substantially the same level as that of the top surface 620a of the second part 620. The second part 620 of the metal plate 600 may vertically overlap the body 410 of the metal flange 400. The metal plate 600 maybe, for example, flat throughout, without an L-shape or Z-shape on the ends.

The bottom surface 410b of the body 410 included in the metal flange 400 may be located at a vertical level between those of the top and bottom surfaces 110a and 110b of the substrate 110. For example, the bottom surface 410b of the body 410 included in the metal flange 400 may extend to a level lower than that of the top surface 110a of the substrate 110.

Figure 4A:
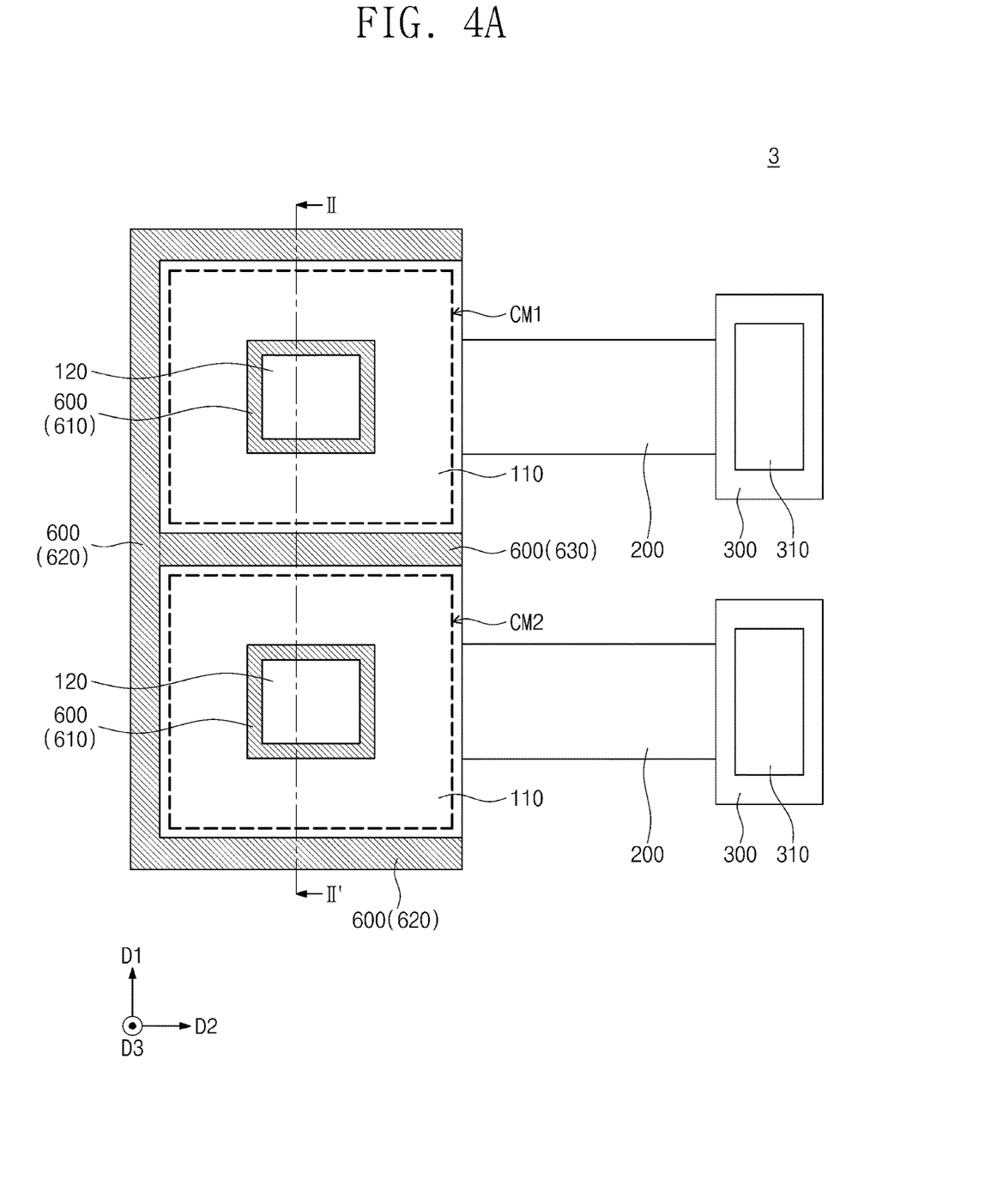
FIG. 4A illustrate a plan view showing an electronic device including a camera module according to some embodiments of the present inventive concepts.
Figure 4B:
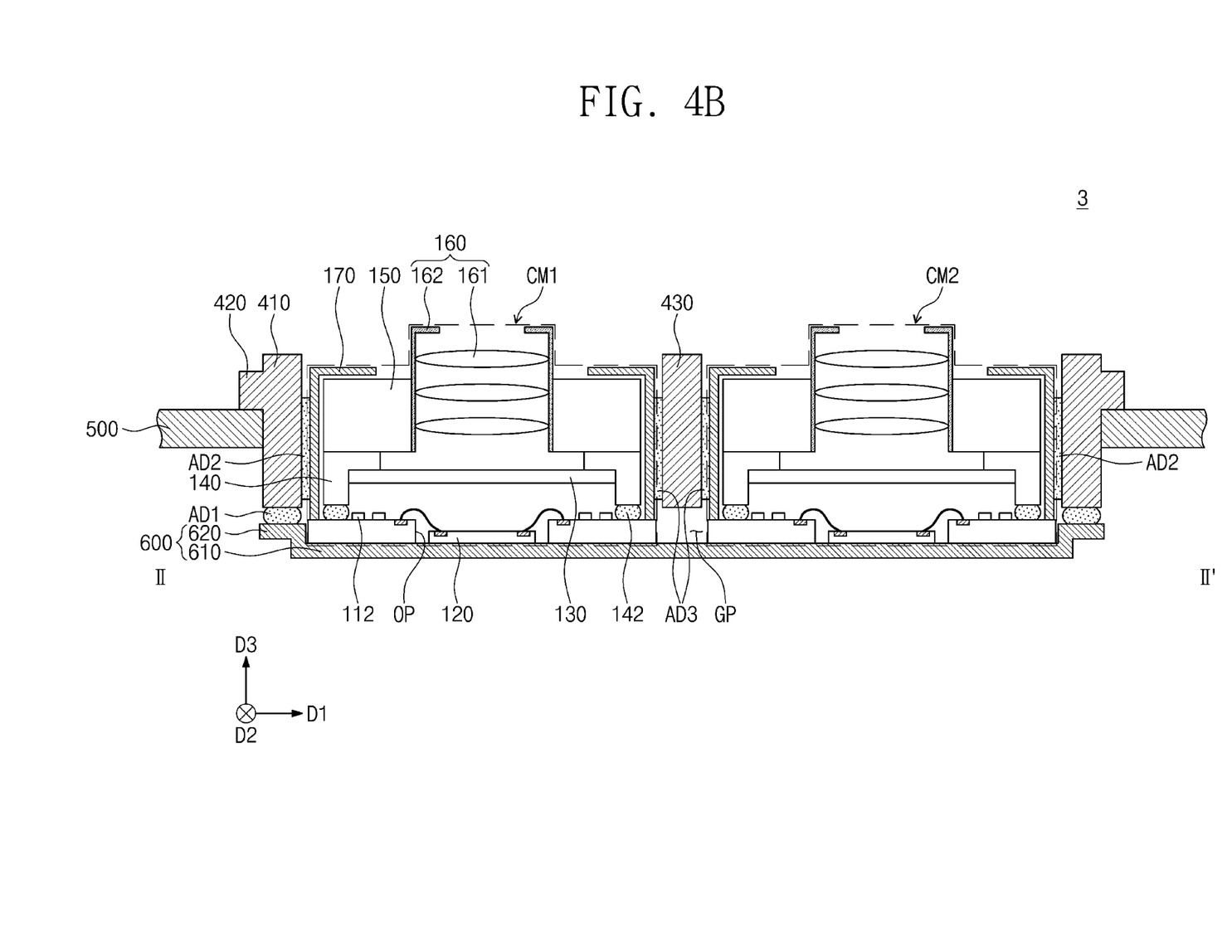
FIG. 4B illustrates a cross-sectional view taken along line II-II' of FIG. 4A, according to some embodiments.

FIG. 4A illustrates a plan view showing an electronic device including a camera module according to some embodiments of the present inventive concepts. FIG. 4B illustrates a cross-sectional view taken along line II-II' of FIG. 4A. Except for the following discussion, the description of features that are the same as those in FIGS. 1 and 2A to 2C will be omitted in order to avoid repetition.

Referring to FIGS. 4A and 4B, an electronic device 3 according to some embodiments may include a first camera module CM1 and a second camera module CM2. The first camera module CM1 and the second camera module CM2 may be substantially the same as the camera module CM discussed above. The bounds of each camera module, as well as the bounds of the camera modules in the other embodiments described herein may be defined on the bottom and on sides of the camera module by the substrate 110 and the outer housing 170. For example, sidewalls of each camera module may be formed by the outer housing 170, and a bottom surface of each camera module may be formed by a bottom surface of the substrate 110.

Each of the first and second camera modules CM1 and CM2 may include a substrate 110. A gap GP may be present between the substrate 110 of the first camera module CM1 and the substrate 110 of the second camera module CM2 (see FIG. 4B).

In addition, each of the first and second camera modules CM1 and CM2 may include a flexible substrate 200 connected to the substrate 110, and may also include an additional substrate 300 and a connector 310.

As shown in FIG. 4B, the body 410 of the metal flange 400 may be provided on the second part 620 of the metal plate 600 depicted in FIG. 4A. The metal flange 400 may serve as a frame including an opening that corresponds to a diameter of the first camera module CM1 and an opening that corresponds to a diameter of the second camera module CM2.

The metal flange 400 may include a first body 410, a protrusion 420, and a second body 430. The first body 410 may correspond to the body 410 discussed above.

The second body 430 of the metal flange 400 may be interposed between the first camera module CM1 and the second camera module CM2. A third adhesion pattern AD3 may be interposed between the second body 430 and the outer housing 170 of the first camera module CM1 and between the second body 430 and the outer housing 170 of the second camera module CM2. The third adhesion pattern AD3 may include or be formed of the same material as that of the first and second adhesion patterns AD1 and AD2.

The metal flange 400 (e.g., the first body 410 and second body 430) may be affixed to the first and second camera modules CM1 and CM2 through the second adhesion pattern AD2, and the third adhesion pattern AD3. Though not shown in FIGS. 4A and 4B, each camera module CM1 and CM2 may have a rectangular shape (e.g., a square shape) from a plan view, and the first body 410 and protrusion 420 may have a rectangular shape from a plan view that surrounds the first camera module CM1 (e.g., surrounds sidewalls of the first camera module CM1) and second camera module CM2 (e.g., surrounds sidewalls of the second camera module CM2). The second body may extend from one side of the rectangular shape to an opposite side, for example in the second direction D2, and in one embodiment, may contact the opposite sides of the rectangular shape formed by the first body 410. The combined first body 410 and second body 430 may cover (e.g., through only an adhesive material) all sidewalls of both the first camera module CM1 and the second camera module CM2.

The metal plate 600 may include a third part 630 that is positioned between the first camera module CM1 and the second camera module CM2, when viewed in a plan view. Differently from the second part 620 of the metal plate 600, the third part 630 of the metal plate 600 may include no bent portion. The second part 620 of the metal plate 600 may combine through the first adhesion pattern AD1 with the first body 410 of the metal flange 400.

According to some embodiments, the gap GP formed between the substrate of the first camera module CM1 and the substrate of the second camera module CM2 may be formed between a bottom of the second body 430 and a top of the third part 630 of the metal plate 600. The gap may be devoid of solid material, and for example may be filled with a gas, such as air. According to some other embodiments, the second body 430 of the metal flange 400 may further extend downwards to combine through an adhesion pattern (e.g., a thermal interface material) with the third part 630 of the metal plate 600. In this embodiment, there may be no gas (e.g., no air) between the substrate of the first camera module CM1 and the substrate of the second camera module CM2.

According to some embodiments, the metal plate 600 may have a flat shape where the third part 630 has a top surface at the same level as that of the top surface 610a of the first part 610 and that of the top surface 620a of the second part 620, as shown in FIG. 3A.

Figure 5A:
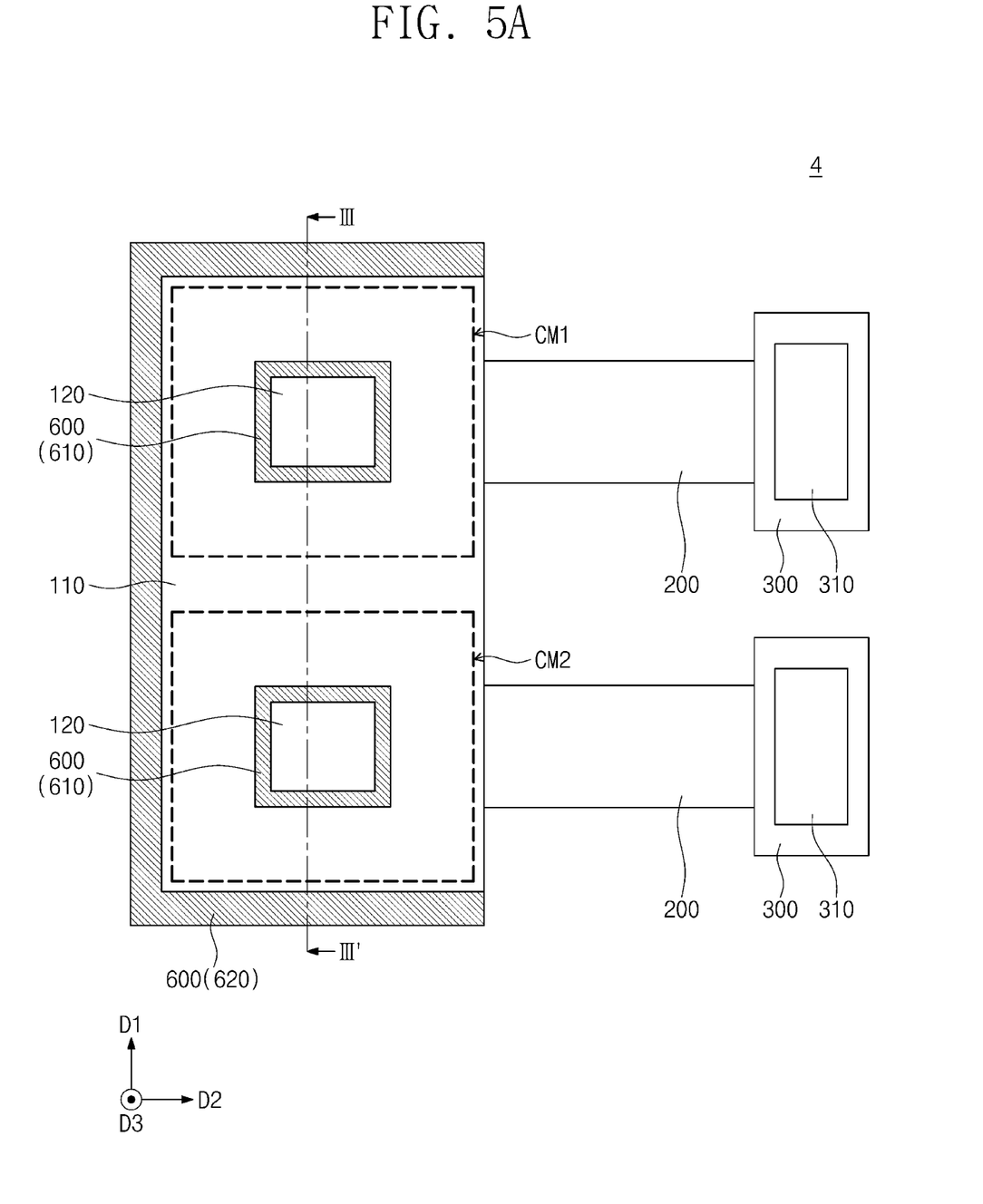
FIG. 5A illustrate a plan view showing an electronic device including a camera module according to some embodiments of the present inventive concepts.
Figure 5B:
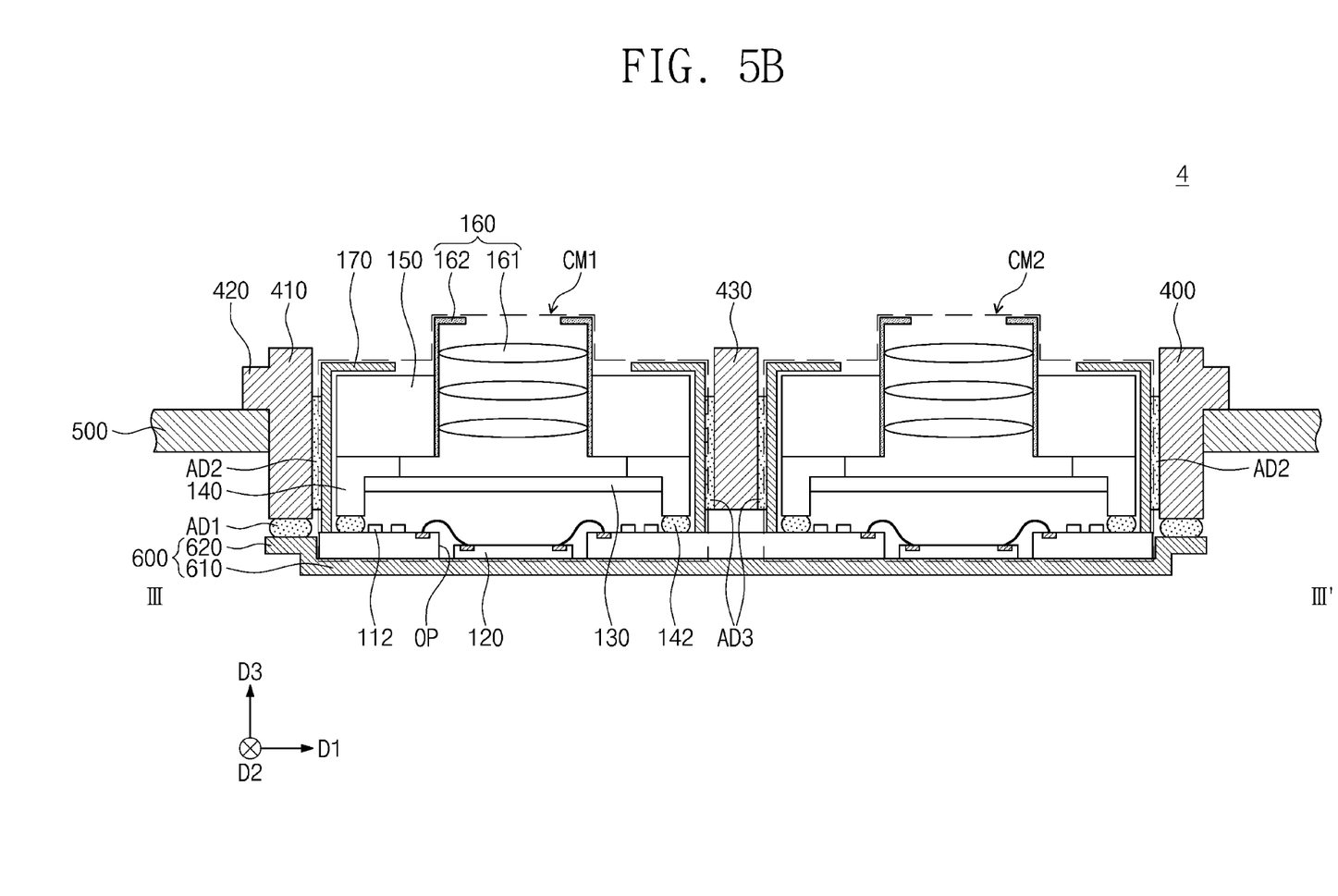
FIG. 5B illustrates a cross-sectional view taken along line of FIG. 5A, according to some embodiments.

FIG. 5A illustrates a plan view showing an electronic device including a camera module according to some embodiments of the present inventive concepts. FIG. 5B illustrates a cross-sectional view taken along line of FIG. 5A. Except for the following discussion, the description of features that are the same as those in FIGS. 4A and 4B will be omitted in order to avoid repetition.

Referring to FIGS. 5A and 5B, an electronic device 4 according to some embodiments may include a first camera module CM1 and a second camera module CM2.

The first camera module CM1 and the second camera module CM2 may be provided on a single substrate 110. For example, the first camera module CM1 and the second camera module CM2 may share one substrate 110, but may occupy different regions of the substrate 110.

An electronic device including a camera module according to the present inventive concepts may be configured to easily discharge heat generated from an image sensor. The image sensor may be configured to thermally contact a metal plate thereunder. The metal plate may extend to thermally contact a metal flange outside the camera module. The metal flange may thermally contact a metal frame of the electronic device. Heat generated from the image sensor may be transferred to all of the metal plate, the metal flange, and metal frame, which may result in an increase in thermal radiation effect. As a result, it may be possible to increase reliability of the electronic device including the camera module.

Although the present inventive concepts have been described in connection with the some embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. An electronic system, comprising:
   a metal plate;
   at least a first camera module on the metal plate;
   a metal flange that covers a sidewall of the first camera module;
   a metal frame connected to the metal flange; and
   a first adhesive material between the metal flange and the metal plate that attaches the metal flange to the metal plate,
   wherein the first camera module includes:
      a substrate that includes at least one cavity, the cavity penetrating the substrate;
      an image sensor in the cavity;
      a lens assembly on the image sensor; and
      an actuator combined with the lens assembly,
   wherein an area from a plan view of the metal plate is greater than an area from the plan view of the substrate,
   wherein the metal plate includes:
      a first part that overlaps the substrate from the plan view; and
      a second part that does not overlap the substrate from the plan view,
   wherein the second part corresponds to an edge portion of the metal plate,
   wherein the image sensor contacts the metal plate through a second adhesive material, and
   wherein a lower portion of the metal flange and the second part of the metal plate contact the first adhesive material.

2. The electronic system of claim 1, wherein the second part of the metal plate has a flipped "L" shape.

3. The electronic system of claim 1, wherein
   a step difference is between the first part of the metal plate and the second part of the metal plate, and
   the second part of the metal plate is at a vertical level above the first part of the metal plate.

4. The electronic system of claim 3, wherein a vertical level of a top surface of the second part included in the metal plate is between a vertical level of a top surface of the substrate and a vertical level of a bottom surface of the substrate.

5. The electronic system of claim 1, wherein a vertical level of a top surface of the second part included in the metal plate is the same as a vertical level of a top surface of the first part included in the metal plate.

6. The electronic system of claim 5, wherein a level of a lowermost portion of the metal flange is between a level of a top surface of the substrate and a level of a bottom surface of the substrate.

7. The electronic system of claim 1, wherein the metal plate includes one of a stainless steel and a copper alloy.

8. The electronic system of claim 1, wherein the metal flange includes one of aluminum, zinc, an aluminum alloy, and a zinc alloy.

9. The electronic system of claim 1, wherein
   the substrate has a first width in a first direction parallel to a top surface of the substrate,
   the metal plate has a second width in the first direction, and
   the second width is about 1.1 times to about 1.5 times the first width.

10. The electronic system of claim 1, wherein the metal flange includes:
    a body that extends in a direction perpendicular to the substrate; and
    a protrusion that protrudes from the body and along a direction parallel to a top surface of the substrate,
    wherein the protrusion is connected to the metal frame.

11. The electronic system of claim 1, wherein the first camera module includes:
    an infrared filter between the substrate and the lens assembly;
    an inner housing that surrounds the infrared filter; and
    an outer housing that surrounds the actuator and the inner housing,
    wherein the outer housing includes metal.

12. The electronic system of claim 11, further comprising an third adhesive material between the outer housing and the metal flange.

13. The electronic system of claim 12, wherein the first adhesive material and the third adhesive material include a thermal interface material (TIM).

14. The electronic system of claim 1, further comprising:
    a second camera module on the metal plate, the second camera module including a substrate,
    wherein the substrate of the first camera module and the substrate of the second camera module are spaced apart from each other.

15. The electronic system of claim 1, further comprising:
    a second camera module on the metal plate,
    wherein the first camera module and the second camera module share the substrate,
    wherein the substrate includes a plurality of cavities.

16. An electronic system, comprising:
a metal plate;
a camera module on the metal plate;
a metal flange that surrounds sidewalls of the camera module;
a metal frame connected to the metal flange;
a first adhesion member between the metal flange and the metal plate; and
a second adhesion member between the metal flange and the camera module,
wherein the camera module includes:
    a substrate having a top surface and a bottom surface, and that includes at least one cavity;
    an image sensor in the cavity; and
    a lens assembly on the image sensor;
wherein the metal flange includes:
    a body that extends in a direction perpendicular to the substrate; and
    a protrusion that protrudes from the body and along a direction parallel to the top surface of the substrate,
wherein a bottom surface of the body included in the metal flange and a top surface of the metal plate contact the first adhesion member, and
wherein a lateral surface of the body included in the metal flange and a lateral surface of the camera module contact the second adhesion member.

17. The electronic system of claim 16, wherein the metal plate includes:
a first part that overlaps the substrate from a plan view; and
a second part that does not overlap the substrate from a plan view,
wherein the second part corresponds to an edge portion of the metal plate, and
wherein the second part contacts the first adhesion member.

18. The electronic system of claim 17, wherein:
a step difference is between the first part of the metal plate and the second part of the metal plate,
the second part is above the first part, and
a vertical level of a top surface of the second part included in the metal plate is between a vertical level of the top surface of the substrate and a vertical level of a bottom surface of the substrate.

19. The electronic system of claim 16, wherein:
a vertical level of a top surface of the second part included in the metal plate is the same as a vertical level of a top surface of the first part included in the metal plate, and
a vertical level of a lowermost portion of the metal flange is between a vertical level of the top surface of the substrate and a vertical level of a bottom surface of the substrate.

20. An electronic system, comprising:
a metal plate;
at least a first camera module on the metal plate;
a metal flange that covers a sidewall of the first camera module;
a metal frame connected to the metal flange; and
a first adhesion member between the metal flange and the metal plate,
wherein the first camera module includes:
    a substrate that includes at least one cavity, the cavity penetrating the substrate;
    a passive element on the substrate;
    an image sensor in the cavity;
    an infrared filter on the image sensor;
    an inner housing that surrounds the infrared filter;
    a lens assembly on the infrared filter;
    an actuator on the inner housing and combined with the lens assembly; and
    an outer housing that surrounds the inner housing and the actuator,
wherein an area of the metal plate, from a plan view, is greater than an area of the substrate, from the plan view,
wherein the metal plate includes:
    a first part that overlaps the substrate from the plan view; and
    a second part that does not overlap the substrate from the plan view,
wherein the image sensor is in thermal contact with the metal plate,
wherein the second part corresponds to an edge portion of the metal plate, and
wherein a lower portion of the metal flange and the second part of the metal plate contact the first adhesion member.

* * * * *